United States Patent [19]

Lin

[11] Patent Number: 4,661,887

[45] Date of Patent: Apr. 28, 1987

[54] SURFACE MOUNTABLE INTEGRATED CIRCUIT PACKAGES HAVING SOLDER BEARING LEADS

[75] Inventor: Paul T. Lin, Austin, Tex.

[73] Assignee: Motorola, Inc., Schaumburg, Ill.

[21] Appl. No.: 793,414

[22] Filed: Oct. 31, 1985

[51] Int. Cl.$^4$ .............................................. H01R 9/09
[52] U.S. Cl. ..................................... 361/405; 29/840; 174/94 R; 339/275 R
[58] Field of Search ............... 361/417, 402, 404, 405, 361/418, 419, 401; 29/827, 832, 840; 228/180.2; 174/68.5, 52 FP, 94 R; 339/275 R, 275 A, 275 B, 275 C, 275 RB, 17 C, 220 R, 221 R; 357/80, 74, 68

[56] References Cited

U.S. PATENT DOCUMENTS

| | | | |
|---|---|---|---|
| 1,702,234 | 2/1929 | Goodridge | 339/275 R |
| 3,842,190 | 10/1974 | Towell | 174/68.5 |
| 4,056,302 | 11/1977 | Braun et al. | 339/275 B |
| 4,274,699 | 6/1981 | Keim | 339/220 X |
| 4,463,407 | 7/1984 | Berger et al. | 361/306 |
| 4,513,355 | 4/1985 | Schroeder et al. | 361/403 |

OTHER PUBLICATIONS

J. W. Balde, et al., "Alternatives in VLSI Packaging," *VLSI Design* Dec., 1983, pp. 23-29.
J. Lyman, "Frame Permits Use of Glass Boards," *Electronics,* Jun. 28, 1984, pp. 54 and 56.
McAfee, "Dual-In-Line Package, Pyggyback structure", IBM Tech. Disclosure Bulletin, vol. 16, No. 4, p. 1315, Sep. 1973, 174-52 FP.

*Primary Examiner*—A. D. Pellinen
*Assistant Examiner*—Morris Ginsburg
*Attorney, Agent, or Firm*—John A. Fisher; Jeffrey Van Myers; David L. Mossman

[57] ABSTRACT

An integrated circuit package having a plurality of leads capable of holding a quantity of solder paste prior to bonding to a printed circuit board or other substrate. The solder paste bearing structure may be straight or spiral grooves, or even a slot or roughened surface, running down at least the lower length of the leads as long as some mechanism is present which will first hold the solder paste or other electrically conductive binder on the lead and then deliver the binder to the end of the lead to produce an electrical and structural bond in a binder flowing operation. Application of the solder paste to the leads is accomplished by simply dipping the package leads into the paste thereby eliminating the need to make a solder mask for the substrate as well as the task of aligning the mask to the substrate.

32 Claims, 4 Drawing Figures

SURFACE MOUNTABLE INTEGRATED CIRCUIT PACKAGES HAVING SOLDER BEARING LEADS

FIELD OF THE INVENTION

The invention relates to integrated circuit (IC) packages and more particularly relates to surface mountable packages for ICs.

BACKGROUND OF THE INVENTION

Integrated circuits were early encased in dual-in-line packages (DIPs), which are small, elongated plastic boxes with the exterior leads coming out on either side of the box and turning down in two parallel rows, one along each side of the package. DIPs are mounted into corresponding holes in a printed circuit board that has been plated through and to which the DIPs are soldered to make electrical and mechanical connection.

As integrated circuits became smaller and more complex, the number of leads coming out of the package increased, even though the package size remained the same or decreased. One solution to this problem was the flat, plastic leadless chip carrier (PLCC), which typically is a small, flat, square package having the leads coming out and formed around each of the four edges of the package. PLCCs are typically mounted in sockets with contacts that mate with the leads on the PLCCs.

More recent PLCCs have even been surface mounted directly on the corresponding pattern of electrical contact pads on a printed circuit board. Surface mounting of parts has gained widespread interest of late because of the ease with which the parts can be picked up and placed on the printed circuit board in contrast to a through-hole package which must be much more precisely aligned. Not only may a printed circuit board be more easily populated with ICs, but they may also be more easily removed. In addition, it is possible to achieve a higher density of ICs on a printed circuit board with surface mount packages. The leads on the packages to be surface mounted are often much shorter and better protected than leads that are mounted through holes in the printed circuit board so that there is less danger of damage to the leads during handling of surface mountable packages. However, current surface mounting techniques also have a number of disadvantages. First, a solder mask for the printed circuit (PC) board must be defined and generated. Next, the solder paste must be applied to the PC board which requires an alignment step. The actual application of solder paste is typically done using a stencil process or a screen process, as in silk screen printing, both of which involve many variables and can be complex. Next, the surface mount device must be picked up and positioned onto the PC board, which has two patterns thereon, the PC artwork and the solder mask artwork. This positioning requires a second alignment step. Finally, the solder undergoes reflow to make the surface joint by either a vapor phase or an infrared (IR) treatment. It would be advantageous if one or both of the alignment steps could be simplified or eliminated.

One innovative way of surface mounting leadless chip-carriers is described by Jerry Lyman in "Frame Permits Use of Glass Boards," *Electronics,* June 28, 1984, pp. 54 and 56. This article describes the use of a square foam frame with solder columns embedded at intervals that correspond to the leads on the chip carrier. During the soldering operation, the foam frame dissolves. However, as integrated circuits became even more complex, even the PLCC has become inadequate to carry all the leads required without making the package unreasonably large.

The most recent solution to the problem of putting a large number of leads on a small package is the pin grid array (PGA). These packages are generally flat and square, but have a large number of leads coming out of the bottom of the package, parallel to each other, perpendicular to the bottom of the package. The PGA packages can contain pin counts on the order of 100 in a 10×10 array or 169 in a 13×13 array or even larger. Discussions of PGA-type packages may be found in U.S. Pat. No. 4,513,355 to Motorola entitled "Metallization and Bonding Means and Method for VLSI Packages," and in J. W. Balde, et al. "Alternatives in VLSI Packaging," *VLSI Design,* December, 1983, pp. 23–29. However, one drawback to PGAs is that they require through-hole mounting in the printed circuit boards due to the high number of leads. A means for surface mounting PGA packages would be welcomed as an advance in the packaging art.

SUMMARY OF THE INVENTION

Accordingly, it is an object of the present invention to provide a surface mountable pin grid array package.

Another object of the invention is to provide a means by which solder paste and other electrical/mechanical bonding compounds may be temporarily supported on the leads of an integrated circuit package prior to connection to the printed circuit board or other substrate.

It is another object of the present invention to achieve the above objects with only a minimal change in the structure of the integrated circuit package leads.

Still another object of the invention is to provide a simplified process for the surface mounting of IC packages having high lead counts.

In carrying out these and other objects of the invention, there is provided, in one form, a surface mountable integrated circuit package having a plurality of exterior package leads with electrically conductive binder bearing means that terminate at a substrate butt joint mounting end. The electrically conductive binder bearing means may be spiral grooves, slots or simply a corrugated or textured surface on at least the lower portion of the leads or pins.

DETAILED DESCRIPTION OF THE INVENTION

Figure 1:
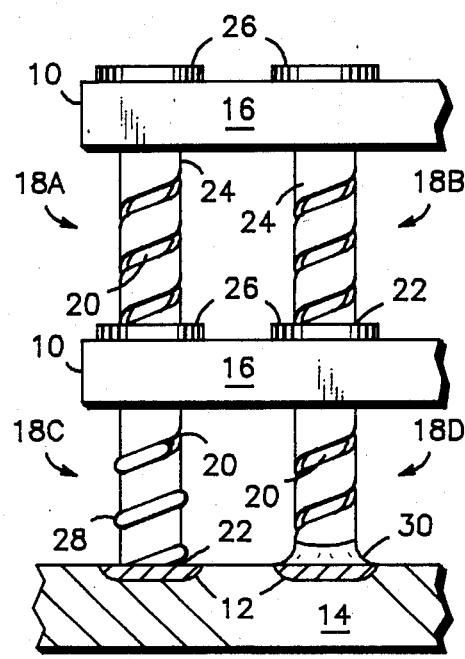
FIG. 1 is a partial side profile view, much larger than actual size, of two stacked pin grid arrays having the pins of this invention which are in various stages of bonding.

Shown in FIG. 1 are two surface mountable integrated circuit packages 10, in this case PGA packages, one mounted on top of the other, the bottommost package 10 in the process of being interconnected to electrical bonding pads 12 on substrate 14 which may be a printed circuit board. Each package 10 has a body 16 from which protrude a plurality of exterior package leads or pins 18, each pin having an electrically conductive binder bearing means 20 or solder paste bearing means 20 which terminate in a substrate butt joint mounting end 22. The length of the leads or pins 18 should be designed to give an optimum standoff height of the PGA package body 16 up and away from substrate 14 with respect to vibration effects on mechanical strength and permitting rinsing and cleaning of the substrate area between the PGA body 16 and substrate 14.

In the particular embodiment shown in FIG. 1, the solder paste bearing means 20 is a spiral groove or channel that spirals downward around the outer surface 24 of pin 18 and terminates at the butt joint mounting end 22. Exterior package leads 18 optionally have swage plates or bonding surfaces 26 opposite the side of PGA package 16 from which they protrude to enable the packages 10 to be stacked on top of one another and to permit the leads 18 of the upper package 10 to be electrically and physically connected to the package 10 immediately below it. This form permits a RAM, ROM, co-processor, such as a floating point co-processor, or other peripheral IC to be stacked on or added to a microprocessor below it, for instance. In addition, bonding surfaces 26 on the top surfaces of package body 16 permit the integrated circuits to be test probed easily after they have been packaged. This is an important advantage since ICs in PGA packages have traditionally been notoriously difficult to test.

To understand how a bonding operation is performed using packages 10 with leads 18 of the present invention, it will be noted in FIG. 1 that leads 18A and 18B are examples of how the leads would appear before any solder paste was applied to them. Of course, in practice, the packages 10 would not be stacked on top of one another without solder paste bearing means 20 containing or bearing solder paste as shown in FIG. 1 which is provided for illustrative purposes only. Lead 18C has solder paste bearing means 20 or spiral groove filled with solder paste 28 that has been applied by dipping package 10 into solder paste of the proper viscosity. It is anticipated that if the solder paste 28 were of a sufficiently "sticky" viscosity and of the proper solids content, and that if the coefficient of friction between the solder paste 28 and pin body 24 were sufficiently high, that the solder paste 28 would adhere to the outer surface of exterior package lead 18 until the bonding step in the absence of a special surface feature such as a groove. In such a situation, the pin body 24 may appear relatively smooth, although it may be somewhat rough, and the solder paste mounting means 20 would simply be the "smooth" surface of the pin body 24.

However, an important embodiment of the invention employs a separate structure as the solder paste bearing means 20, such as the spiral groove shown in FIG. 1. Such a structure facilitates the adhesion of an appropriate amount of solder paste 28 to exterior lead 18. Upon heating, the solder paste 28 flows down the exterior lead 18 via spiral groove 20 toward the substrate butt joint mounting end 22 to form a solder joint 30 as seen at the bottom of lead 18D. Again, although solder paste 28 that adheres to the relatively smooth surface of pin body 24 without a separate structure means to hold it would produce a similar bond during an interconnection operation, the use of a separate structure such as the spiral groove 20 seen in the FIG. 1 pins 18 helps channel the solder paste to a proper bonding configuration upon electrical bonding pads 12. In addition, the use of a separate means 20 enables pins 18 to hold more solder paste 28 and thus provide a structurally stronger bond 30.

Substrate butt joint mounting ends 22 may be bonded to the corresponding bonding pads 12 of substrate 14 by vapor phase or infrared or belt type furnace reflow operations to soften the solder and permit it to slowly flow down the pin 18 to make the bond 30. Of course, in actual practice, all of the leads 18 of a particular package 10 would bear the same amount of solder paste 28 and bond simultaneously to the substrate 14 during the solder reflow operation. In other words, it is unlikely that lead 18C and lead 18D could coexist on the same PGA package 10 in actual practice, for all of the pins 18 on a particular package 10 should look like lead 18C just before bonding or like lead 18D just after bonding.

The simplification of the bonding process by means of the present invention in comparison with the prior commercial technique may be more readily appreciated by a comparision of the flow steps outlined below.

| Current Industry Process | Present Invention Process |
|---|---|
| 1. Define/generate solder mask. | 1. No mask required. |
| 2. Screen solder paste on PC board (first alignment). | 2. Pick up surface mount device and dip into solder paste (no alignment). |
| 3. Pick up surface mount device and position onto PC board (second alignment). | 3. Position device onto PC board (first and only alignment). |
| 4. Reflow for surface joint (either by vapor phase or IR). | 4. Reflow for surface joint or for device stacking (vapor phase, IR or belt type furnace reflow). |

The above comparison demonstrates that the invention provides a simpler process flow with only one alignment step. Elimination of an alignment step is important because any slight misalignment may be of critical importance to proper functioning of the overall circuit. Another source of error is also removed with the deletion of the mask step.

Figure 2:
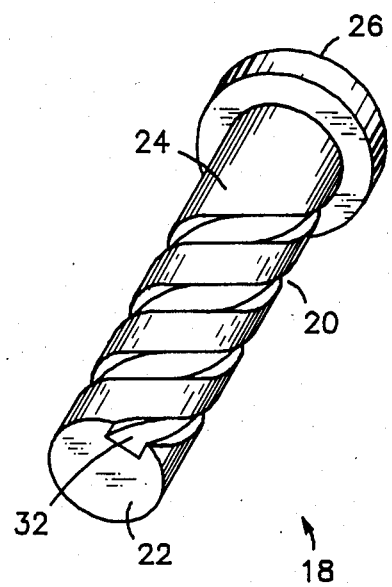
FIG. 2 is a detailed perspective view of a single PGA pin of the present invention.

Shown in FIG. 2 is a detailed view from the bottom of a lead 18 having a solder paste bearing means 20 in the form of a spiral groove running at least partway down the length of pin body 24 to terminate in a slot 32 at substrate butt joint mounting end 22. It should be apparent that during bonding the solder paste in spiral groove 20 will flow down the groove 20 and outward from the slot 32 to electrically and mechanically bond the pin 18 to the substrate 14. FIG. 2 also clearly shows the relationship of optional bonding surface 26 to the top of pin 18.

Figure 3:
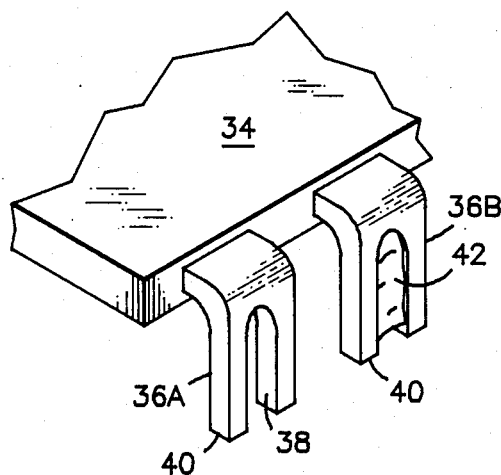
FIG. 3 is a partial perspective view of a DIP package having leads made in accordance with the invention.

Shown in FIG. 3 is another embodiment of the invention where a dual-in-line package (DIP) 34, partially shown, has a plurality of downwardly bent, flat leads 36 which have a solder paste bearing means 38 in the form of an open slot running partially down the length of the lead 36 and terminating and opening at substrate butt joint mounting end 40. Lead 36A is an example of an empty lead 36 before contact with solder paste whereas lead 36B is an example of a lead 36 that has been dipped in solder paste 42 which now coats and fills the solder paste bearing slot 38.

As in the previously discussed embodiment, in practice the DIP 34 is dipped leads-down into solder paste 42 of the proper viscosity such that all flat leads 36 simultaneously receive a uniform amount of solder paste 42 into solder paste bearing slots 38. The DIP 34 is then correctly positioned on a substrate such that leads 36 correspond properly to the electrical bonding pads on the substrate, and a solder reflow step is used to bring solder paste 42 down slots 38 to form an electrical and mechanical bond with the bonding pads on the substrate.

Figure 4:
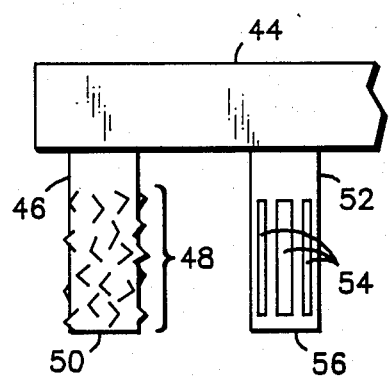
FIG. 4 is a partial side profile view of a PGA package having pins with alternate embodiments of the invention for retaining electrically conductive binder on their surfaces.

Shown in FIG. 4 is a PGA package 44 which bears exterior package leads 46 and 52 showing alternate embodiments of the invention. For example, lead 46 has a solder paste bearing means 48 which is a region of roughened surface extending down the lower part of pin 46 to terminate in substrate butt joint mounting end 50. The roughened surface region 48 provides increased friction between the solder paste and the pin 46 thereby increasing adhesion of the solder paste as it is briefly stored and transported on pin 46 prior to solder reflow and bonding.

In another alternate embodiment, pin 52 possesses a solder paste bearing means 54 in the form of vertical slots which run part-way down the length of pin 52 and terminate in the vicinity of substrate butt joint mounting end 56. Note that vertical slots do not extend completely to mounting end 56 but stop somewhat short of the end 56 in this particular embodiment unlike spiral groove 20 in FIG. 2. It is apparent that the solder paste resides within vertical slots 54 after dipping PGA 44 in the solder paste and before the bonding/solder reflow step. During the reflow operation, the solder paste flows out of the slots 54 down the remainder of pin 52 to form the bond.

Thus, a surface mountable PGA has been provided along with a method for providing a butt joint of the PGA on a printed circuit board or other substrate. The PC board mounting process has been simplified by eliminating the paste screen step and by improving the registration alignment tolerance, since only one pattern appears on the PC board rather than two, thus making it easier to align the device with the PC artwork. In addition, the potential is provided for multiple chip modules with individually pre-testable layers. The use of solder joints on metal pins also minimizes metal migration problems due to the use of CuSil (copper-silicon alloy) particularly since the bonding surfaces 26 and bonding pads 12 can be made smaller and thus further apart due to the ease of alignment using the method of this invention. It should be noted that the structure and techniques of this invention can be applied to present standard multilayer ceramic PGAs as well as single layer low cost PGAs, in addition to DIP and PLCC butt joint configurations.

I claim:

1. A surface mountable integrated circuit package comprising a plurality of exterior package leads having integral electrically conductive binder bearing means each terminating at a substrate butt joint mounting end for guiding an electrically conductive binder thereto in a reflow operation.

2. The surface mountable integrated circuit package of claim 1 wherein the integral electrically conductive binder bearing means is at least one groove that runs at least down the lower half of each exterior package lead.

3. The surface mountable integrated circuit package of claim 2 wherein the binder groove spirals around the exterior package lead.

4. The surface mountable integrated circuit package of claim 1 wherein the integral electrically conductive binder bearing means is a slot piercing through the exterior lead along part of the length of each exterior package lead.

5. The surface mountable integrated circuit package of claim 1 wherein the integral electrically conductive binder bearing means comprises a region of increased roughness on the exterior surface thereof.

6. The surface mountable integrated circuit package of claim 1 wherein the package is a pin grid array (PGA) having the plurality of exterior package leads protruding downward perpendicularly from the package.

7. The surface mountable integrated circuit package of claim 6 wherein the exterior package leads each have a bonding surface on a surface of the package opposite that from which they protrude perpendicularly.

8. The surface mountable integrated circuit package of claim 1 in which the package is a dual-in-line package (DIP) and the exterior package leads have a flat, rectangular profile with the integral electrically conductive binder bearing means present along the lower portion of the leads.

9. The surface mountable integrated circuit package of claim 8 wherein the integral electrically conductive binder bearing means is a slot piercing through part of the length of each exterior package lead.

10. A surface mountable integrated circuit package comprising a plurality of exterior package leads each having integral solder paste bearing means for holding solder paste on the leads prior to a solder reflow operation and for delivering solder paste downward via gravity toward a substrate butt joint mounting end in the solder reflow mounting operation.

11. A method for mounting an integrated circuit package to a mounting substrate wherein the integrated circuit package comprises a plurality of exterior package leads each having integral solder paste bearing means, comprising the steps of:
   simultaneously applying solder paste to the solder paste bearing means of the exterior package leads by dipping the package leads into a solder paste such that the solder paste contacts and adheres to the solder paste bearing means;
   positioning the integrated circuit package leads to correspond to a pattern of electrical pads on a mounting substrate; and
   flowing the solder paste on the solder paste bearing means of the exterior package leads toward the corresponding electrical pads for electrically bonding the leads to the pads.

12. A surface mountable integrated circuit package comprising a plurality of exterior package leads, each lead having a butt joint mounting end and an exterior surface where the exterior surface has at least one integral solder paste channeling means therein for carrying solder downward to the butt joint mounting end in a solder flowing operation.

13. The surface mountable integrated circuit package of claim 12 wherein the integral solder paste channeling means is at least one groove that runs at least down the lower half of the exterior package lead.

14. The surface mountable integrated circuit package of claim 13 wherein the solder paste groove spirals around the exterior package lead.

15. The surface mountable integrated circuit package of claim 12 wherein the integral solder paste channeling means is a slot piercing through the exterior lead along part of the length of each exterior package lead.

16. The surface mountable integrated circuit package of claim 12 wherein the integral solder paste channeling means comprises a region of increased roughness on the exterior surface thereof.

17. The surface mountable integrated circuit package of claim 12 wherein the package is a pin grid array (PGA) having the plurality of exterior package leads protruding downward perpendicularly from the package.

18. The surface mountable integrated circuit package of claim 17 wherein the exterior package leads each have a bonding surface on a surface of the package opposite that from which they protrude perpendicularly.

19. The surface mountable integrated circuit package of claim 12 in which the package is a dual-in-line package (DIP) and the exterior package leads have a flat, rectangular profile with the integral solder paste channeling means present along the lower portion of the leads.

20. The surface mountable integrated circuit package of claim 19 wherein the integral solder paste channeling means is a slot piercing through part of the length of each exterior package lead.

21. A surface mountable pin grid array (PGA) integrated circuit package comprising a plurality of exterior package leads, each lead having a butt joint mounting end and an exterior surface where the exterior surface has at least one integral spiral solder paste channeling groove therein for carrying solder paste downward to the butt joint mounting end in a solder flowing operation.

22. The surface mountable (PGA) integrated circuit package of claim 21 wherein the exterior package leads each have a bonding surface on a surface of the package opposite that from which they protrude perpendicularly.

23. A method for mounting an integrated circuit pin grid array (PGA) package to a mounting substrate wherein the integrated circuit package comprises a plurality of exterior package pins each having integral spiral solder paste bearing grooves along at least the lower part of their length, comprising the steps of:
   simultaneously applying solder paste to the integral spiral solder paste bearing grooves of the exterior package pins by dipping the package leads into a solder paste such that the solder paste contacts and adheres to the solder paste bearing grooves;
   positioning the integrated circuit package pins to correspond to a pattern of electrical pads on said mounting substrate; and
   flowing the solder paste on the spiral solder paste bearing grooves of the exterior package pins toward the corresponding electrical pads for electrically bonding the leads to the pads.

24. A surface mountable integrated circuit package assembly comprising a surface mountable integrated circuit package having a plurality of exterior package leads having integral electrically conductive binder bearing means each terminating at a substrate butt joint mounting end to channel electrically conductive binder thereto in a reflow operation, and a quantity of electrically conductive binder upon each bearing means.

25. The surface mountable integrated circuit package assembly of claim 24 wherein the integral electrically conductive binder bearing means on the leads of the package comprises at least one groove that runs at least down the lower half of each exterior package lead.

26. The surface mountable integrated circuit package assembly of claim 25 wherein the binder groove spirals around the exterior package lead.

27. The surface mountable integrated circuit package assembly of claim 24 wherein the integral electrically conductive binder bearing means of the package is a slot piercing through the exterior lead along part of the length of each exterior package lead.

28. The surface mountable integrated circuit package assembly of claim 24 wherein the integral electrically conductive binder bearing means of the package comprises a region of increased roughness on the exterior surface thereof.

29. The surface mountable integrated circuit package assembly of claim 24 wherein the package is a pin grid array (PGA) having the plurality of exterior package leads protruding downward perpendicularly from the package.

30. The surface mountable integrated circuit package assembly of claim 29 wherein the exterior package leads of the PGA each have a bonding surface on a surface of the package opposite that from which they protrude perpendicularly.

31. The surface mountable integrated circuit package assembly of claim 24 in which the package is a dual-in-line package (DIP) and the exterior package leads have a flat, rectangular profile with the integral electrically conductive binder bearing means present along the lower portion of the leads.

32. The surface mountable integrated circuit package assembly of claim 31 wherein the integral electrically conductive binder bearing means on the leads of the package is a slot piercing through part of the length of each exterior package lead.

* * * * *